United States Patent
Hu et al.

(10) Patent No.: US 12,204,072 B2
(45) Date of Patent: Jan. 21, 2025

(54) ANTI-REFLECTIVE GLASS, AND PREPARATION METHOD THEREFOR AND APPLICATION THEREOF

(71) Applicant: Chongqing Aureavia Hi-tech Glass Co., Ltd., Chongqing (CN)

(72) Inventors: Wei Hu, Chongqing (CN); Baoquan Tan, Chongqing (CN)

(73) Assignee: Chongqing Aureavia Hi-Tech Glass Co., Ltd., Chongqing (CN)

( * ) Notice: Subject to any disclaimer, the term of this patent is extended or adjusted under 35 U.S.C. 154(b) by 483 days.

(21) Appl. No.: 17/583,169

(22) Filed: Jan. 24, 2022

(65) Prior Publication Data

US 2022/0146714 A1   May 12, 2022

Related U.S. Application Data

(63) Continuation of application No. PCT/CN2019/097038, filed on Jul. 22, 2019.

(51) Int. Cl.

| | |
|---|---|
| *G02B 1/118* | (2015.01) |
| *C03C 15/00* | (2006.01) |
| *C03C 17/00* | (2006.01) |
| *C03C 23/00* | (2006.01) |
| *G02B 1/12* | (2006.01) |

(52) U.S. Cl.
CPC ............ *G02B 1/118* (2013.01); *C03C 15/00* (2013.01); *C03C 17/001* (2013.01); *C03C 23/00* (2013.01); *G02B 1/12* (2013.01); *C03C 2204/08* (2013.01); *C03C 2217/73* (2013.01)

(58) Field of Classification Search
CPC ........... G02B 1/118; G02B 1/12; C03C 15/00; C03C 17/001; C03C 23/00; C03C 2204/08; C03C 2217/73; Y02E 10/50; H01L 31/0236; H01L 31/048
See application file for complete search history.

(56) References Cited

U.S. PATENT DOCUMENTS

2018/0071881 A1\*   3/2018   Horie .................... B24B 29/005

FOREIGN PATENT DOCUMENTS

| CN | 101314522 A | 12/2008 |
|---|---|---|
| CN | 102887647 A | 1/2013 |

(Continued)

OTHER PUBLICATIONS

International Search Report of PCT Patent Application No. PCT/CN2019/097038 issued on Apr. 22, 2020.

*Primary Examiner* — George G. King

(57) ABSTRACT

An anti-reflective glass, a preparation method and an application thereof are provided. The anti-reflective glass comprises a glass matrix, at least one surface of the glass matrix is provided with an undulating hill morphology layer, which forms a whole piece with the glass matrix, the hill morphology layer consists of a plurality of irregularly distributed hill raised micro-structures along a Z-axis direction. The present anti-reflective glass has hill morphology surface which can significantly reduce the light reflectivity and increase the light transmittance, the perspective effect of the light is improved; the preparation method simplifies the etching process effectively, and the condition is controllable, the undulating hill morphology formed on the glass surface by etching is effectively ensured, and the optical performance is stable.

10 Claims, 2 Drawing Sheets

(56) References Cited

FOREIGN PATENT DOCUMENTS

| | | | |
|---|---|---|---|
| CN | 105152542 A | 12/2015 | |
| CN | 105366961 A | 3/2016 | |
| CN | 106470954 A | 3/2017 | |
| CN | 107074626 A | 8/2017 | |
| CN | 108516693 A | 9/2018 | |
| CN | 109437578 A | 3/2019 | |
| JP | 2015096462 A | 5/2015 | |
| WO | WO-2013047184 A1 * | 4/2013 | ........... G02B 5/0221 |

* cited by examiner

ANTI-REFLECTIVE GLASS, AND PREPARATION METHOD THEREFOR AND APPLICATION THEREOF

CROSS-REFERENCE TO RELATED APPLICATION

The present application is a continuation application of PCT Patent Application No. PCT/CN2019/097038 filed on Jul. 22, 2019, the contents of which are hereby incorporated by reference in their entirety.

TECHNICAL FIELD

The present disclosure relates to the technical field of a glass product, in particular to anti-reflective glass, a preparation method and an application thereof.

BACKGROUND

With the characteristics of transparency, high temperature resistance and the like, the glass is widely applied in daily life. For example, the glass has been widely applied in the fields of protective devices, decoration, optical instruments, etc.

Since interface refractive indexes of two mediums mutate, the light has inconsistent propagation speeds in the two mediums, therefore the reflection is the main reason causing energy loss. Due to the transparency of the glass, the light will generate refraction and reflection when irradiating on the glass surface. However, when incident light generates a reflection phenomenon, the light transmittance is inevitably reduced. Although it is necessary to improve the reflectivity of the light in some application scenarios, when the glass is applied in a transparent protective product, the light reflection is an adverse factor, which will not only reduce the light transmittance, but also affect the perspective effect and definition of the glass. Moreover, the reflection phenomenon of the light will cause a glare phenomenon in this application scenario, thereby causing visual discomfort of an observer or reducing visual operation performance. With the constantly increased application of the glass in an electronic product such as a communication product, a solar cell and other fields, the requirements on reducing the light reflection and improving the light transmittance of the glass are higher and higher.

At present, the glass industry is making continuous improvements in order to reduce the light reflection and improve the light transmittance of the glass. For example, in the current disclosed technologies, one kind of technology is to realize reducing the reflectivity of the glass and improving the light transmittance of the glass by pasting a functional film on a surface of a glass main body, and the representative technology is that a multi-layer oxide thin film is coated on the glass surface or an optical resin functional layer with a micro-structure is formed on the glass surface. However, due to increasing the total thickness of the glass, on the one hand, this method affects the light transmittance, for example, the maximum reflectivity of the current disclosed transmissivity improvement film alternately depositing and coating by adopting a titanium oxide thin film and a silicon dioxide thin film can only be more than 2%, and the glass coating the traditional transmissivity improvement film cannot clearly display patterns or characters under hard light, so a glare phenomenon will occur. On the other hand, the transmissivity improvement film is formed on the glass surface afterwards, so the bonding strength between the transmissivity improvement film and the glass surface is not good, and the transmissivity improvement film is easy to fall off during a long-term use process. Along the increased use time, the transmissivity improvement effect of the transmissivity improvement film loses gradually. When a large-size surface greater than 1×1 m adopts the deposition coating, the coating uniformity cannot be controlled, therefore the large-size coating also needs special custom equipment, which has expensive manufacturing cost, and then the popularity of a light reflection technology of the glass and satisfaction of appeals in various fields are greatly restricted.

Another kind of technology is to transform the glass surface directly, for example, the glass surface is processed, including wet etching, plasma etching technology, focused ion beam processing technology and laser processing technology, etc. However, the transmissivity improvement glass processed and obtained through these existing methods still has non-ideal anti-reflection and transmissivity improvement effects and other deficiencies of hard control or high cost, etc.

SUMMARY

In order to overcome the deficiencies in the prior art, the present disclosure provides an anti-reflective glass, so as to solve the technical problems of non-ideal or unstable anti-reflection and transmissivity improvement effects in the current anti-reflective glass.

Another purpose of the present disclosure is to provide a preparation method for the above-said anti-reflective glass, so as to solve the technical problems of hard control or high cost of process conditions in the current preparation method for the anti-reflective glass.

In order to achieve the purpose of the present disclosure, the first aspect of the present disclosure provides an anti-reflective glass. The anti-reflective glass comprises a glass matrix, at least one surface of the glass matrix is provided with an undulating hill morphology layer, the hill morphology layer consists of a plurality of hill raised micro-structures along a Z-axis direction, and the hill raised micro-structures are irregularly distributed, wherein the hill morphology layer has a RSm range of 38 μm-300 μm, a Rz range of 0.075 μm-9.2 μm and a Rp range of 0.007 μm-3.3 μm for reducing glare and reflection, and the hill morphology layer has a reflectivity range of is 0.1%-2.5%.

The second aspect of the present disclosure provides a preparation method for the anti-reflective glass. The preparation method for the anti-reflective glass comprises the following steps:

After the pretreatment without any shielding, masking or etching impedance, a surface to be etched of the glass matrix is subjected to the surface etching treatment directly through a wet acid solution.

The third aspect of the present disclosure provides a use of the anti-reflective glass in a display glass cover plate of an electronic product, a solar photovoltaic glass substrate and an LED (Light-emitting Diode) luminescent device glass substrate.

Compared with the prior art, at least one surface of the anti-reflective glass in the present disclosure is provided with the undulating hill morphology layer structure, and the reflectivity of the anti-reflective glass is significantly reduced by controlling the micro-structure characteristic in the hill morphology layer, for example, the light reflectivity may be reduced to 0.1%-2.5%, one the one hand, the light transmittance is significantly increased, the perspective effect of the light is improved, and on the other hand, the glare phenomenon can be effectively avoided.

The preparation method for the anti-reflective glass provided by the present disclosure adopts the wet etching on the surface of the glass matrix directly, so an etching process is effectively simplified, and the condition is controllable, and then the undulating hill morphology layer structure formed on the glass surface by etching is effectively ensured. In addition, with a stable optical performance and high efficiency, the preparation cost of the anti-reflective glass is effectively reduced.

Due to excellent optical performance, the anti-reflective glass provided by the present disclosure can improve the light transmissivity and the perspective effect of a corresponding product, reduce or avoid the glare phenomenon after being applied in the corresponding product.

DETAILED DESCRIPTION OF THE EMBODIMENTS

In order to make the technical problem, technical solution and beneficial effects of the present disclosure more clear, the present disclosure will be further described in details in combination with the embodiments below. It is understood that the embodiments described herein are only used for explaining the present disclosure instead of limiting the present disclosure.

The relevant special names are explained below:

Chemically strengthened glass: which is the chemically toughened glass processed by a high temperature ion exchange process. In high temperature molten salt, great alkali metal ions replace small alkali metal ions in the glass so as to generate a volume difference of exchange ions. Pressure stress from high to low is generated in a surface layer of mother glass, so as to hinder and delay the extension of glass microcrack, and achieve the purpose of improving the mechanical strength of the glass.

Physically strengthened glass: which is also known as the physically toughened glass or the tempered toughened glass. When ordinary sheet glass is heated to a temperature closing to the softening temperature (600° C.) of the glass in a heating furnace, the inner stress can be eliminated through its own deformation, and then the glass is removed from the heating furnace, then the high-pressure cold air is blown to the two sides of the glass by cluster nozzles, so that the glass can be quickly and uniformly cooled to a room temperature, namely, the toughened glass is made.

RSm, Rz, Rp and Ra are indexes for evaluating surface roughness, and specifically evaluating the surface roughness of the hill topography layer in the embodiments of the present disclosure, wherein RSm represents the average width of an outline, Rz represents the average peak-valley depth, Rp represents the average crest height of the outline, and Ra represents the arithmetic mean roughness.

Figure 1:
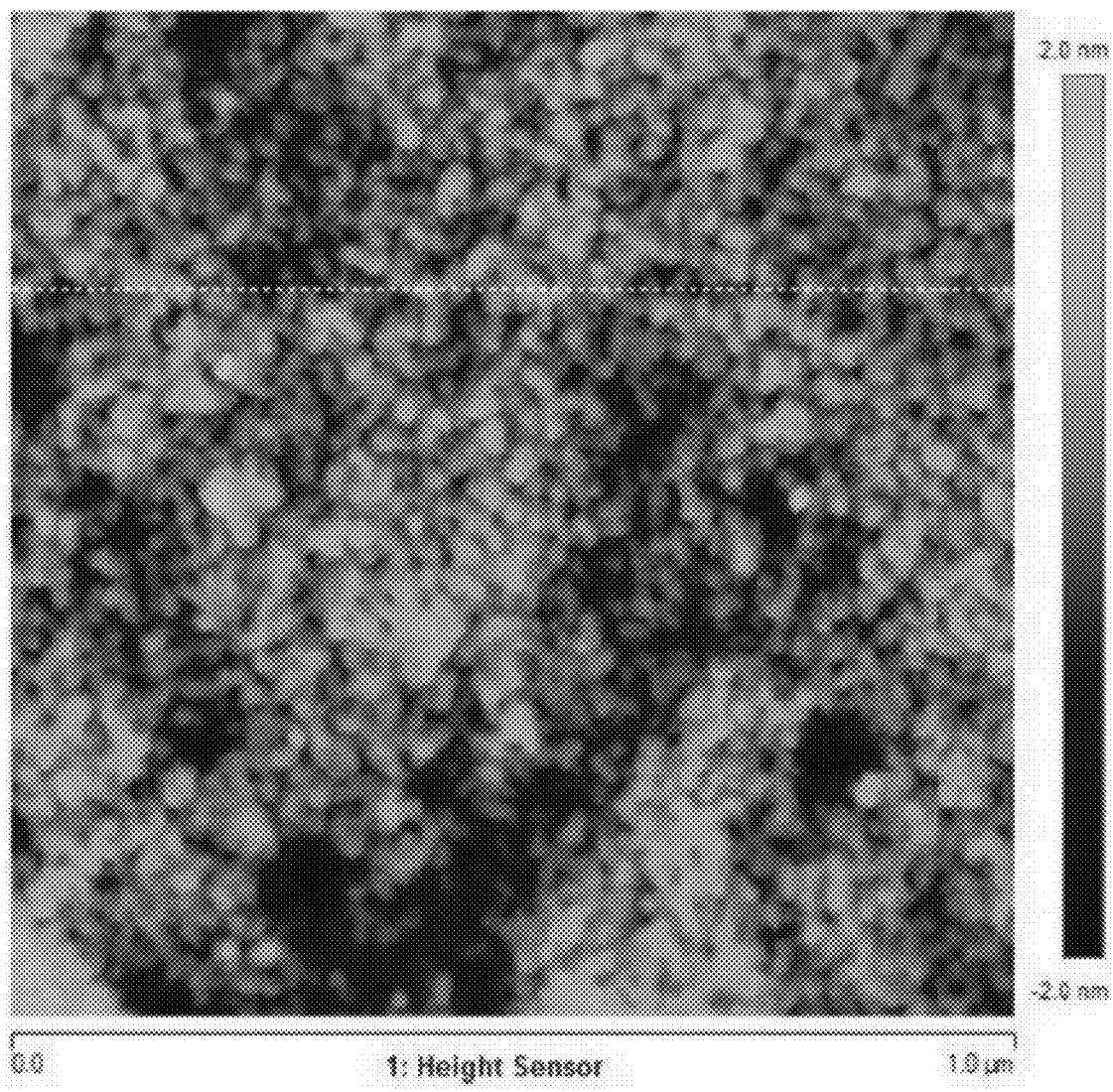
FIG. 1 is an atomic force microscope photo of anti-reflective glass in one embodiment of the present disclosure.
Figure 2:
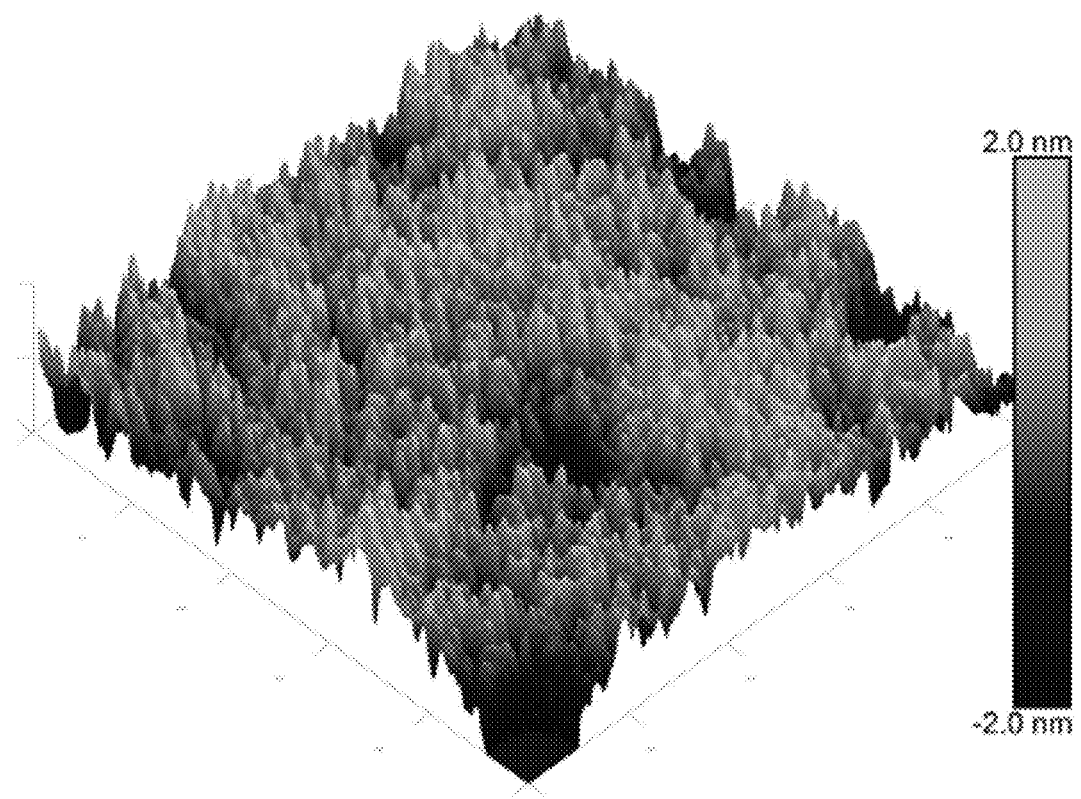
FIG. 2 is an atomic force microscope three-dimensional photo of the anti-reflective glass in the embodiment of the present disclosure as shown in FIG. 1.

On the one hand, the present disclosure provides anti-reflective glass. At least one surface of the anti-reflective glass is provided with a micro-structure, and the AFM (Atomic Force Microscope) photo of the micro-structure surface of the anti-reflective glass is as shown in FIG. 1 and FIG. 2. The micro-structure surface of the anti-reflective glass is the undulating hill morphology, of which the micro-structure forms the hill morphology layer. Therefore, the anti-reflective glass comprises a glass matrix, and at least one surface of the glass matrix is provided with the undulating hill morphology layer, the hill morphology layer is composed of a plurality of hill raised micro-structures along a Z-axis direction, and the hill raised micro-structures are irregularly distributed.

Further, it can be known, from the AFM photos as shown in FIG. 1 and FIG. 2, that each single raised micro-structure has a tower structure, and the bottoms of the adjacent hill raised micro-structures are mutually connected. Moreover, the hill raised micro-structures are not of uniform size, similar in morphology but not exactly the same.

Through detection, it can be known that the RSm range of the hill is 38 $\mu$m-300 $\mu$m, preferably 38 $\mu$m-250 $\mu$m, the Rz range is 0.075 $\mu$m-9.2 $\mu$m, preferably 0.1 $\mu$m-9.2 $\mu$m, and the Rp range is 0.007 $\mu$m-3.3 $\mu$m, preferably 0.015 $\mu$m-3.3 $\mu$m. The suitable haze of the hill with the morphology characteristic can effectively avoid the glare phenomenon, for example, the measured reflectivity range of the hill is 0.1%-2.5%, preferably 0.5%-2.0%, and more preferably 0.5%-1.5%.

Moreover, it can be known through detection that the surface roughness Ra of the hill morphology layer of the anti-reflective glass is 9 nm-15 nm.

After testing the optical performance of the anti-reflective glass in the above embodiments, it can be known that, in one embodiment, when the two surfaces of the anti-reflective glass are provided with the hill morphology layers, the thickness of the anti-reflective glass is less than 1.1 mm and the incident light to the hill morphology layer is 550 nm, the light transmissivity of the measured incident light at the hill morphology layer is 98%-99.9%; when the incident light to the hill morphology layer is 375 nm, the light transmissivity of the measured incident light is 97%-99.9%, or when incident light to the hill morphology layer is 325-375 nm, the average light transmissivity of the measured incident light is 93%-99.9%.

Or in one embodiment, when only one surface of the anti-reflective glass is provided with the hill morphology layer, the thickness of the anti-reflective glass is less than 1.1 mm and the incident light to the surface of the hill morphology layer is 550 nm, the light transmissivity of the measured incident light is 94%-95.9%; when the incident light to the surface of the hill morphology layer is 375 nm, the light transmissivity of the measured incident light is 93%-95.9%, or when incident light to the surface of the hill morphology layer is 325-375 nm, the average light transmissivity of the measured incident light is 89%-95.9%.

In a further embodiment, when the anti-reflective glass is glass ceramics, both the two surfaces of the anti-reflective glass are provided with the hill morphology layers and the thickness of the anti-reflective glass is less than 1.1 mm, and the incident light to the hill morphology layer is 200-325 nm, the average light transmissivity of the measured incident light is 94%-99.9%. Or when the anti-reflective glass is glass ceramics, and only one surface of the anti-reflective glass is provided with the hill morphology layer and the thickness of the anti-reflective glass is less than 1.1 mm, and the incident light to the surface of the hill morphology layer is 200-325 nm, and the average light transmissivity of the measured incident light is 90%-95.9%.

In a further embodiment, when the anti-reflective glass is alkali glass or alkali-free glass, both the two surfaces of the anti-reflective glass are provided with the hill morphology layers and the thickness of the anti-reflective glass is less than 1.1 mm, and the incident light to the hill morphology layer is 550 nm, the light transmissivity of the measured incident light is 95%-95.9%; when the incident light to the hill morphology layer is 375 nm, the light transmissivity of the measured incident light is greater than 94%, such as 94%-99.9%, or when incident light to the hill morphology layer is 325-375 nm, the average light transmissivity of the measured incident light is 90%-99.9%. Or when the anti-reflective glass is alkali glass or alkali-free glass, only one surface of the anti-reflective glass is provided with the hill morphology layer and the thickness of the anti-reflective glass is less than 1.1 mm, and the incident light to the surface of the hill morphology layer is 550 nm, the light transmissivity of the measured incident light is 91%-95.9%; when the incident light to the surface of the hill morphology layer is 375 nm, the light transmissivity of the measured incident light is 90%-95.9%, or when the incident light to the surface of the hill morphology layer is 325-375 nm, the average light transmissivity of the measured incident light is 86%-95.9%.

In a further embodiment, when the anti-reflective glass is quartz glass, the two surfaces of the anti-reflective glass are provided with the hill morphology layers and the thickness of the anti-reflective glass is less than 1.1 mm, and the incident light to the hill morphology layer is 200-325 nm, the light transmissivity of the measured incident light is 90%-99.9%. Or when the anti-reflective glass is the quartz glass, and only one surface of the anti-reflective glass is provided with the hill morphology layer and the thickness of the anti-reflective glass is less than 1.1 mm, and the incident light to the surface of the hill morphology layer is 200-325 nm, the light transmissivity of the incident light is 86%-95.9%.

By observing and measuring the surface microscopic result of the anti-reflective glass and detecting the optical performance of the anti-reflective glass, it can be known that the anti-reflective glass can significantly reduce the reflectivity of the incident light and improve the light transmittance so as to significantly improve the perspective effect of the light and effectively avoid the glare phenomenon.

In addition, the glass matrix of the anti-reflective glass in the above embodiments and the hill morphology layer (certainly comprising the hill raised micro-structure formed in the hill morphology layer) have the consistent chemical composition, namely, the same chemical components. Specifically, the hill morphology layer may be directly etched and formed on the glass main body of the anti-reflective glass. Thus, the hill morphology layer of the anti-reflective glass and the glass matrix can form a whole effectively, so that the undulating hill morphology layer is firmly combined with the glass matrix, can keep stable for a long time, and then the optical performance of the anti-reflective glass can keep stable without adding the light transmissivity film. When the light reflectivity is effectively reduced and the light transmittance is added, the thickness of the anti-reflective glass can avoid adding, so that the light transmittance of the anti-reflective glass is improved, and the optical performance of the anti-reflective glass is significantly improved. Therefore, the anti-reflective glass effectively overcomes the deficiency of the current additional light transmissivity film.

Further, the anti-reflective glass in the above embodiments may be any one of the glass not chemically strengthened or physically processed, chemically strengthened glass or physically tempered glass.

Therefore, the anti-reflective glass can significantly reduce the reflectivity of the incident light and improve the light transmittance so as to significantly improve the perspective effect of the light and effectively avoid the glare phenomenon.

On the other hand, the present disclosure further provides a preparation method for the anti-reflective glass. The preparation method for the anti-reflective glass comprises the following steps:

After the pretreatment without any shielding, masking or etching impedance, a surface to be etched of the glass matrix is subjected to the surface etching treatment directly through a wet acid solution.

In particular, the undulating hill morphology formed on the etched glass surface as well as the distribution, the size and the like of the hill raised micro-structure in the hill morphology may be effectively controlled and optimized by controlling the acid solution and the etching process conditions.

In one embodiment, the preparation method for the anti-reflective glass comprises the following steps of:

S0, obtaining a certain size of glass matrix not chemically strengthened or physically tempered, and cleaning the glass matrix;

S1, performing single-side protection on the glass matrix or not protecting the glass matrix, and performing the surface etching treatment on the surface to be etched of the glass matrix by adopting the acid solution; and S2, cleaning the surface etched glass after removing the single-side protection measure or cleaning the surface etched glass without single-side protection measure.

The glass matrix not chemically strengthened or physically tempered in S0 may be any one of the glass not chemically strengthened or physically processed, chemically strengthened glass or physically tempered glass. The glass matrix may be cleaned according to the conventional cleaning method for the glass, so as to remove impurities adhered to the surface of the glass matrix.

In one embodiment, the single-side protection treatment in S1 comprises coating an anti-corrosive film or screen printing/spraying anti-corrosive ink or coating/screen printing anti-corrosive glue. The protection for a non-etched area of the glass matrix is realized through the single-side protection treatment, so that the contact between the glass surface in this area and the acid solution is isolated.

In one embodiment, the surface etching treatment in S1 comprises vertically placed groove soaking treatment of the glass matrix or horizontally passed spraying treatment of the glass matrix or horizontally passed soaking treatment of the glass matrix. In a specific embodiment, the time range of the vertically placed groove soaking treatment of the glass matrix is 2 min-95 min, preferably 2 min-45 min; the time range of the horizontally passed spraying treatment of the glass matrix is 0.5 min-75 min, preferably 0.5 min-35 min, and the time range of the horizontally passed soaking treatment of the glass matrix is 1 min-85 min, preferably 1 min-40 min.

In the above embodiments, the acid solution comprises fluoride ion, and at least one selected from the group consisting of nitrate and sulfate compounds, and in particular, the mass percent range of the fluoride ion accounting for the acid solution is 0.1%-40%, or the mass percent range of the nitrate compound accounting for the acid solution is 0.1%-60%, or the mass percent range of the sulfate compound accounting for the acid solution is 0.1%-65%.

In another embodiment, the acid solution comprises hydrogen fluoride and at least one selected from the group consisting of ammonium fluoride, ammonium bifluoride, nitric acid, sulfuric acid, phosphoric acid and hydrochloric acid. The acid solution ratio is as follows: the mass percent range of the hydrogen fluoride accounting for the acid solution is 0.2%-55%, the mass percent range of the ammonium fluoride accounting for the acid solution is 0.2%-60%, the mass percent range of the ammonium bifluoride accounting for the acid solution is 0.2%-50%, the mass percent range of the nitric acid accounting for the acid solution is 0.2%-70%, the mass percent range of the sulfuric acid accounting for the acid solution is 0.2%-80%, the mass percent range of the phosphoric acid accounting for the acid solution is 0.2%-65%, or the mass percent range of the hydrochloric acid accounting for the acid solution is 0.2%-75%.

Preferably, when the acid solution comprises hydrogen fluoride and at least one selected from the group consisting of ammonium fluoride, ammonium bifluoride, nitric acid, sulfuric acid, phosphoric acid and hydrochloric acid, the mass percent range of the hydrogen fluoride accounting for the acid solution is 0.2%-10%, preferably 0.2%-5%. The mass percent range of the ammonium fluoride accounting for the acid solution is 0.2%-15%, the mass percent range of the ammonium bifluoride accounting for the acid solution is 0.2%-12%, the mass percent range of the nitric acid accounting for the acid solution is 0.2%-25%, the mass percent range of the sulfuric acid accounting for the acid solution is 0.2%-40%, the mass percent range of the phosphoric acid accounting for the acid solution is 0.2%-10%, preferably 0.2%-5%, or the mass percent range of the hydrochloric acid accounting for the acid solution is 0.2%-45%.

In another embodiment, the acid solution comprises hydrogen fluoride, and at least three selected from the group consisting of ammonium fluoride, ammonium bifluoride, nitric acid, sulfuric acid, phosphoric acid and hydrochloric acid, wherein the mass percent range of the hydrogen fluoride accounting for the acid solution is 0.2%45%. The mass percent range of the ammonium fluoride accounting for the acid solution is 0.2%-22%, the mass percent range of the ammonium bifluoride accounting for the acid solution is 0.2%-16%, the mass percent range of the nitric acid accounting for the acid solution is 0.2%-25%, the mass percent range of the sulfuric acid accounting for the acid solution is 0.2%-25%, the mass percent range of the phosphoric acid accounting for the acid solution is 0.2%-8%, or the mass percent range of the hydrochloric acid accounting for the acid solution is 0.2%-10%, and the rest is water.

Preferably, when the acid solution comprises hydrogen fluoride, and at least three selected from the group consisting of ammonium fluoride, ammonium bifluoride, nitric acid, sulfuric acid, phosphoric acid and hydrochloric acid, the acid solution ratio is as follows: the mass percent range of the hydrogen fluoride accounting for the acid solution is 0.2%-10%, the mass percent range of the ammonium fluoride accounting for the acid solution is 0.2%-18%, the mass percent range of the ammonium bifluoride accounting for the acid solution is 0.2%-13%, the mass percent range of the nitric acid accounting for the acid solution is 0.2%-5%, the mass percent range of the sulfuric acid accounting for the acid solution is 0.2%-12%, the mass percent range of the phosphoric acid accounting for the acid solution is 0.2%-5%, or the hydrochloric acid content is 0.2%-6%, and the rest is water.

By controlling and optimizing the above formula of the acid solution, and controlling and optimizing the etching process conditions in combination with the acid solution, the effective etching for the surface to be etched of the glass matrix is realized, so that the surface to be etched is etched as the undulating hill morphology layer included the above anti-reflective glass, as shown in FIG. 1 and FIG. 2. Then the etched glass, namely, the anti-reflective glass described above and the anti-reflective glass formed by etching have specific micro-structure surfaces, so that the anti-reflective glass has low light reflectivity, the glare phenomenon is effectively avoided, and the perspective effect of the anti-reflective glass is improved. In addition, the preparation method simplifies the etching process effectively, and the condition is controllable, and then the undulating hill morphology formed on the glass surface by etching is effectively ensured. In addition, with a stable optical performance and high efficiency, the preparation cost of the anti-reflective glass is effectively reduced.

On another hand, based on the anti-reflective glass and the preparation method thereof, the anti-reflective glass has low light reflectivity and high light transmittance, the preparation method for the anti-reflective glass can be effectively controlled, and the prepared anti-reflective glass has the stable optical performance. Therefore, the above anti-reflective glass can be applied in a display glass cover plate of an electronic product, a solar photovoltaic glass substrate and an LED luminescent device glass substrate, so as to improve the light transmittance and the perspective effect of the corresponding product, and reduce or avoid the glare phenomenon.

Examples 1-12

The Examples 1-12 respectively provide anti-reflective glass and a preparation method for the anti-reflective glass. The anti-reflective glass comprises a glass matrix, at least one surface formed on the glass matrix is provided with an undulating hill morphology layer, which is as shown in FIG. 1 and composed of a plurality of hill raised micro-structures along a Z-axis direction, the hill raised micro-structures are irregularly distributed, wherein the single raised micro-structure is a tower structure, and the bottoms of the adjacent hill raised micro-structures are mutually connected. Moreover, the hill raised micro-structures are not of uniform size, similar in morphology but not exactly the same.

The preparation method for the anti-reflective glass comprised the following steps of:

S0, obtaining a certain size of glass matrix, and cleaning the glass matrix;

S1, performing the surface etching treatment on the surface to be etched of the glass matrix by adopting the acid solution; and S2, cleaning the surface etched glass after removing the single-side protection measure or cleaning the surface etched glass without single-side protection measure.

Specifically, the relevant characteristic parameters of the glass matrix, the surface treatment to be etched, the acid solution, the surface etching treatment method and condition and the anti-reflective glass formed by etching in the above embodiments are as shown in the Table 1. It can be known, from the relevant data in the Table 1 as well as the corresponding surface morphology characteristics and the relevant optical performance of the anti-reflective glass provided in the above embodiments, that the optical surface with the micro-structure of the anti-reflective glass in the embodiment of the present disclosure has low light reflectivity, the light transmittance is significantly improved, so that the perspective effect of the anti-reflective glass is significantly improved, and the optical performance is stable.

The above is only optional embodiments of the present disclosure and not intended to limit the present disclosure. Any modifications, equivalent replacements, improvements and the like made within the spirit and principle of the present disclosure shall fall within the protection scope of the present disclosure.

TABLE 1

|  |  | Example 1 | Example 2 | Example 3 | Example 4 | Example 5 | Example 6 |
|---|---|---|---|---|---|---|---|
| Glass matrix | | Glass not chemically strengthened | Chemically strengthened glass | Glass not physically tempered | Physically tempered glass | Glass ceramics | Quartz glass |
| Etched acid solution | | 0.2 wt % HF + 60% NH$_4$F | 55 wt % HF + 0.2% NH$_4$F | 0.2 wt % HF + 69% HNO$_3$ | 5 wt % HF + 80 wt % H$_2$SO$_4$ + 0.2% HNO$_3$ | 0.3 wt % H$_2$SO$_4$ + 65 wt % H$_3$PO$_4$ + 15 wt % NH$_4$F | 0.5% H$_3$PO$_4$ + 30 wt % HF + 0.2 wt % HCl |
| Surface etching treatment method | | Vertically placed groove soaking treatment: condition: double-side soaking treatment was 5 min | Vertically placed groove soaking treatment: condition: double-side soaking treatment was 2 min | Vertically placed groove soaking treatment: condition: double-side soaking treatment was 12 min | Vertically placed groove soaking treatment: condition: double-side soaking treatment was 6 min | Vertically placed groove soaking treatment: condition: double-side soaking treatment was 20 min | Vertically placed groove soaking treatment: condition: double-side soaking treatment was 3 min |
| Relevant parameters of anti-reflective glass | | | | | | | |
| Hill morphology | RSm (μm) | 267 | 299 | 38 | 46 | 62 | 207 |
| | Rz (μm) | 8.01 | 9.16 | 0.076 | 0.36 | 0.59 | 6.78 |
| | Rp (μm) | 2.95 | 3.15 | 0.0075 | 0.58 | 1.26 | 3.49 |
| | Reflectivity | 0.5% | 0.13% | 2.5% | 1.5% | 1.9% | 1.2% |
| 550 Nm transmittance | | 99.7% | 99.8% | 98.0% | 98% | 98.2% | 98.1% |

|  |  | Example 7 | Example 8 | Example 9 | Example 10 | Example 11 | Example 12 |
|---|---|---|---|---|---|---|---|
| Glass matrix | | Glass not chemically strengthened | Chemically strengthened glass | Glass not physically tempered | Physically tempered glass | Glass ceramics | Quartz glass |
| Etched acid solution | | 15% H$_3$PO$_4$ + 10 wt % HF + 74 wt % HCl | 0.2 wt % HF + 60 wt % NH$_4$F + 18 wt % HNO$_3$ | 0.2 wt % HF + 60 wt % NH$_4$F + 18 wt % HNO$_3$ | 0.2 wt % HF + 60 wt % NH$_4$F + 18 wt % HNO$_3$ | 0.2 wt % HF + 40 wt % NH$_4$F | 8 wt % HF |
| Surface etching treatment method | | Vertically placed groove soaking treatment: condition: double-side soaking treatment was 20 min | Vertically placed groove soaking treatment: condition: single-side soaking treatment was 95 min | Horizontally passed soaking treatment of the glass matrix: condition: single-side soaking treatment was 3 min | Horizontally passed soaking treatment of the glass matrix: condition: single-side soaking treatment was 82 min | Horizontally passed spraying treatment of the glass matrix: condition: single-side soaking treatment was 1 min | Horizontally passed spraying treatment of the glass matrix: condition: single-side soaking treatment was 75 min |
| Relevant parameters of anti-reflective glass | | | | | | | |
| Hill morphology | RSm (μm) | 5.9 | 287 | 38 | 273 | 38.5 | 253 |
| | Rz (μm) | 0.54 | 9.08 | 0.075 | 9.0 | 0.077 | 8.0 |
| | Rp (μm) | 1.18 | 3.09 | 0.007 | 3.01 | 0.007 | 3.11 |
| | Reflectivity | 2.2% | 0.15% | 2.5% | 0.12% | 0.5% | 0.41% |
| 550 nm transmittance | | 94.4% | 95.9% | 94% | 95.9% | 95.6% | 95.9% |

What is claimed is:

1. An anti-reflective glass comprising a glass matrix, wherein: at least one surface of the glass matrix is provided with an undulating hill morphology layer, the hill morphology layer consists of a plurality of hill raised micro-structures along a Z-axis direction, and the hill raised micro-structures are irregularly distributed, wherein the hill morphology layer has an average width of an outline, RSm, range of 38 μm-300 μm, an average peak-valley depth, Rz, range of 0.075 μm-9.2 μm and an average crest height of the outline, Rp, range of 0.007 μm-3.3 μm for reducing glare and reflection, and the hill morphology layer has a reflectivity range of 0.1%-2.5%.

2. The anti-reflective glass of claim 1, wherein each of the hill raised micro-structures has a tower structure, and the two adjacent hill raised micro-structures are mutually connected at the bottoms.

3. The anti-reflective glass of claim 1, wherein the hill morphology layer and the glass matrix have same chemical components.

4. The anti-reflective glass of claim 1, wherein the hill morphology has a RSm range of 38 μm-250 μm, a Rz range of 0.1 μm-9.2 μm and a Rp range of 0.015 μm-3.3 μm, and the hill morphology layer has a reflectivity range of 0.1%-2.0%.

5. The anti-reflective glass of claim 1, wherein the hill morphology layer has an arithmetic mean roughness, Ra, in range of 9 nm-15 nm.

6. The anti-reflective glass of claim 1, wherein when both two surfaces of the anti-reflective glass are provided with the hill morphology layers, the anti-reflective glass has a thickness of less than 1.1 mm, wherein:

when an incident light to the hill morphology layer is 550 nm, the incident light has a light transmissivity of 98%-99.9%;

when an incident light to the hill morphology layer is 375 nm, the light transmissivity is 97%-99.9%;

when the incident light to the hill morphology layer is 325-375 nm, the light transmissivity is 93%-99.9% in average;

or only one surface of the anti-reflective glass is provided with the hill morphology layer, the anti-reflective glass has a thickness of less than 1.1 mm, and when an incident light to the surface of the hill morphology layer is 550 nm, the incident light has a light transmissivity of 94%-95.9%;

when an incident light to the surface of the hill morphology layer is 375 nm, the incident light has a light transmissivity of 93%-95.9%;

when an incident light to the surface of the hill morphology layer is 325-375 nm, the incident light has a light transmissivity of 89%-95.9% in average.

7. The anti-reflective glass of claim 1, wherein the anti-reflective glass is glass ceramics, both two surfaces of the anti-reflective glass are provided with the hill morphology layer, and the anti-reflective glass has a thickness of less than 1.1 mm, when an incident light to the hill morphology layer is 200-325 nm, the incident light has a light transmissivity of 94%-99.9% in average;

or the anti-reflective glass is glass ceramics, only one surface of the anti-reflective glass is provided with the hill morphology layer, and the anti-reflective glass has a thickness less than 1.1 mm, when an incident light to the surface of the hill morphology layer is 200-325 nm, the incident light has a light transmissivity of 90%-95.9% in average.

8. The anti-reflective glass of claim 1, wherein the anti-reflective glass is alkali glass or alkali-free glass, both two surfaces of the anti-reflective glass are provided with the hill morphology layers, and the anti-reflective glass has a thickness of less than 1.1 mm; wherein:

when an incident light to the hill morphology layer is 550 nm, the incident light has a light transmissivity of 95%-99.9%;

when an incident light to the hill morphology layer is 375 nm, the incident light has a light transmissivity of 94%-99.9%;

when an incident light to the hill morphology layer is 325-375 nm, the incident light has a light transmissivity of 90%-99.9% in average;

or, the anti-reflective glass is alkali glass or alkali-free glass, only one surface of the anti-reflective glass is provided with the hill morphology layer, the anti-reflective glass has a thickness of less than 1.1 mm, wherein:

when an incident light to the surface of the hill morphology layer is 550 nm, the incident light has a light transmissivity of 91%-95.9%;

when an incident light to the surface of the hill morphology layer is 375 nm, the incident light has a light transmissivity of is 90%-95.9%;

when an incident light to the surface of the hill morphology layer is 325-375 nm, the incident light has a light transmissivity of 86%-95.9% in average.

9. The anti-reflective glass of claim 1, wherein the anti-reflective glass is a quartz glass, both two surfaces of the anti-reflective glass are provided with the hill morphology layers, and the anti-reflective glass has a thickness of less than 1.1 mm, when an incident light to the hill morphology layer is 200-325 nm, the incident light has a light transmissivity of 90%-99.9%;

or, the anti-reflective glass is a quartz glass, only one surface of the anti-reflective glass is provided with the hill morphology layer, and the anti-reflective glass has a thickness of less than 1.1 mm, when an incident light to the surface of the hill morphology layer is 200-325 nm, the incident light has a light transmissivity of 86%-95.9%.

10. The anti-reflective glass of claim 1, wherein the anti-reflective glass is strengthened or tempered glass.

* * * * *